(12) United States Patent
Kadonaga et al.

(10) Patent No.: US 8,034,673 B2
(45) Date of Patent: Oct. 11, 2011

(54) FILM FORMATION METHOD AND APPARATUS FOR FORMING SILICON-CONTAINING INSULATING FILM DOPED WITH METAL

(75) Inventors: Kentaro Kadonaga, Nirasaki (JP); Yamato Tonegawa, Nirasaki (JP); Pao-Hwa Chou, Nirasaki (JP); Kazuhide Hasebe, Nirasaki (JP); Tetsuya Shibata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 165 days.

(21) Appl. No.: 12/417,939

(22) Filed: Jun. 9, 2009

(65) Prior Publication Data
US 2009/0263975 A1 Oct. 22, 2009

(30) Foreign Application Priority Data
Apr. 18, 2008 (JP) ................................. 2008-109613

(51) Int. Cl.
*H01L 21/00* (2006.01)

(52) U.S. Cl. ..................................................... 438/151
(58) Field of Classification Search .................. None
See application file for complete search history.

(56) References Cited

U.S. PATENT DOCUMENTS

| 2005/0208714 A1* | 9/2005 | Yamazaki et al. ............ 438/166 |
| 2006/0286817 A1 | 12/2006 | Kato et al. |
| 2008/0085610 A1* | 4/2008 | Wang et al. .................... 438/785 |

FOREIGN PATENT DOCUMENTS

| JP | 6-45256 | 2/1994 |
| JP | 11-87341 | 3/1999 |
| JP | 2006-229233 | 8/2006 |

* cited by examiner

*Primary Examiner* — Walter L Lindsay, Jr.
*Assistant Examiner* — Andre' C Stevenson
(74) *Attorney, Agent, or Firm* — Smith, Gambrell & Russell, LLP

(57) ABSTRACT

A film formation method for a semiconductor process performs a film formation process to form a silicon-containing insulating film doped with a metal on a target substrate, in a process field inside a process container configured to be selectively supplied with a silicon source gas and a metal source gas. The method includes forming a first insulating thin layer by use of a chemical reaction of the silicon source gas, while maintaining a shut-off state of supply of the metal source gas; then, forming a first metal thin layer by use of a chemical reaction of the metal source gas, while maintaining a shut-off state of supply of the silicon source gas; and then, forming a second insulating thin layer by use of the chemical reaction of the silicon source gas, while maintaining a shut-off state of supply of the metal source gas.

17 Claims, 8 Drawing Sheets

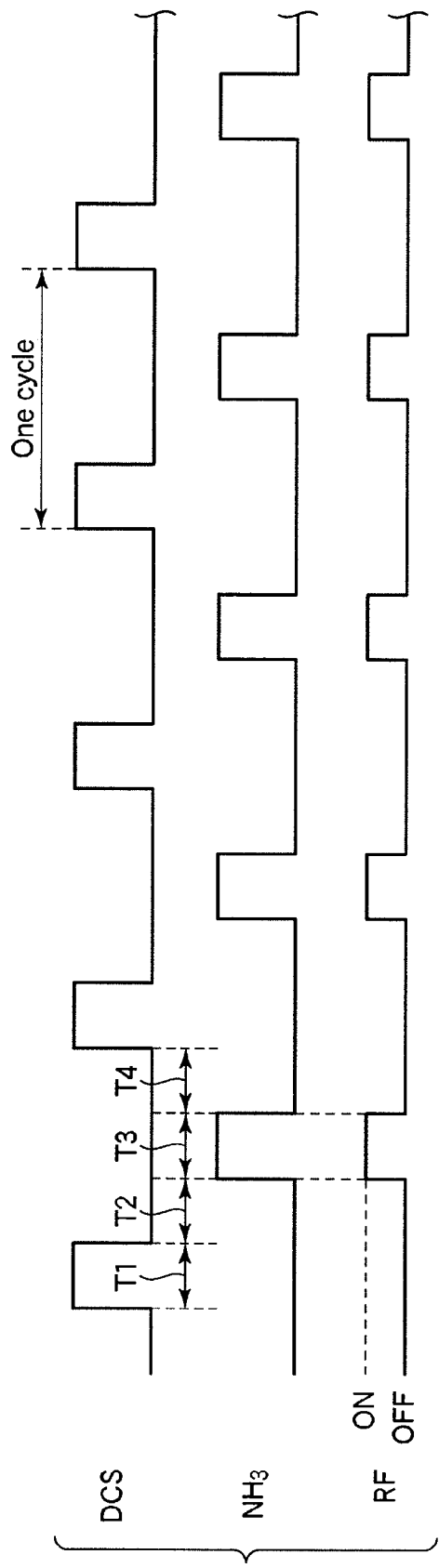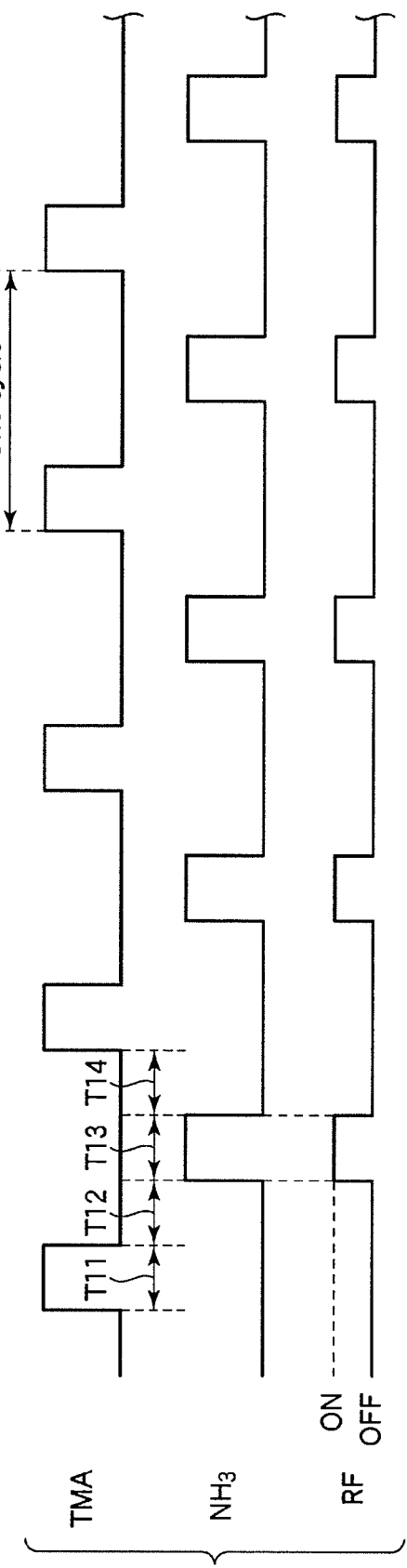

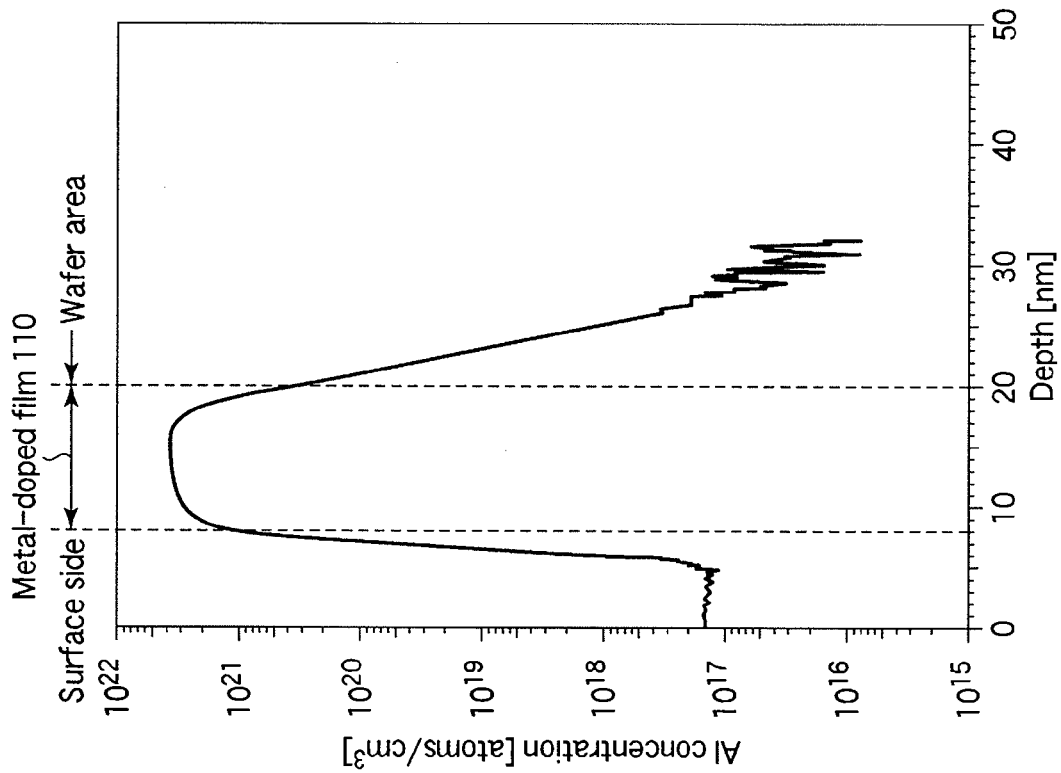
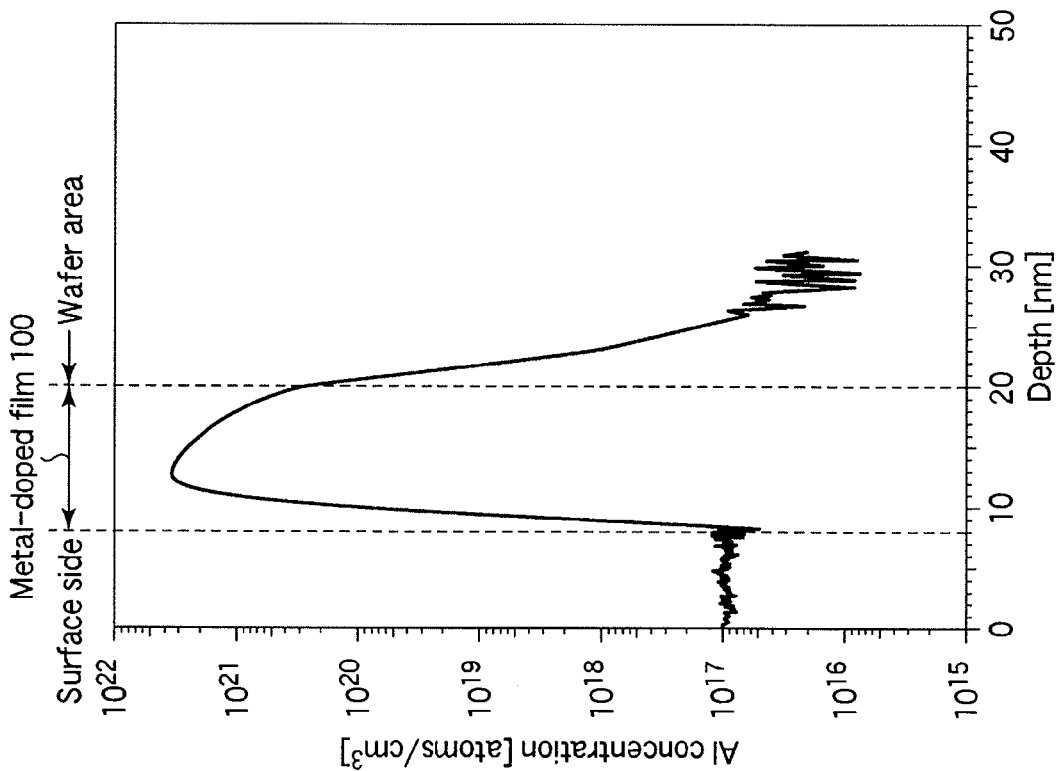

FILM FORMATION METHOD AND APPARATUS FOR FORMING SILICON-CONTAINING INSULATING FILM DOPED WITH METAL

BACKGROUND OF THE INVENTION

1. Field of the Invention

The present invention relates to a film formation method and apparatus for a semiconductor process for forming a silicon-containing insulating film doped with a metal on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

Nonvolatile memory devices are known as semiconductor integrated circuits of this kind. The nonvolatile memory devices encompass floating gate type memory devices including a floating gate and SONOS type memory devices including an electric charge trap layer (Jpn. Pat. Appln. KOKAI Publication No. 2006-229233). Recently, SONOS type memory devices including an electric charge trap layer have attracted attention, because they are relatively well operated in writing and erasing. A SONOS type memory device has a structure in which a silicon oxide film, an electric charge trap layer formed of a silicon nitride film, and a silicon oxide film are interposed between a semiconductor substrate, such as a silicon substrate, and a gate electrode made of, e.g., polysilicon.

The electric charge trap layer is formed of a metal-doped film, which is a silicon nitride film (SiN film) doped with a metal, such as aluminum. Where a memory device includes such a film doped with a metal, the memory device is improved in some of the operational characteristics, such as writing, erasing, and retention.

For example, as a method for forming a metal-doped film of this kind, there is a method using a CVD (Chemical Vapor Deposition) method arranged to simultaneously supply film formation gases for forming an SiN film and a gas containing the metal into a process container. Further, there is a method for forming a film having a predetermined thickness, by alternately and intermittently supplying film formation gases to repeatedly laminate very thin layers each having an atomic or molecular level thickness one by one (for example, Jpn. Pat. Appln. KOKAI Publications No. 6-45256 and No. 11-087341). In general, this film formation method is called ALD (Atomic layer Deposition) or MLD (Molecular Layer Deposition), which allows a predetermined process to be performed without exposing wafers to a very high temperature.

Incidentally, in metal-doped films of this kind, the metal concentration in the film and the concentration distribution in the film thickness direction exert large influences on some of the characteristics of the metal-doped films. However, conventional methods described above for forming a metal-doped film tend to cause the metal concentration to be relatively higher, and thus entails a difficultly in setting the metal concentration to be relatively lower with high controllability. In this case, the electrical characteristic of the metal-doped film cannot be sufficiently improved. Particularly, in recent years, owing to the demands of increased miniaturization and integration of semiconductor integrated circuits, the problem described above needs to be solved.

BRIEF SUMMARY OF THE INVENTION

An object of the present invention is to provide a film formation method and apparatus for a semiconductor process for forming a silicon-containing insulating film doped with a metal, which can set the metal concentration to be relatively lower with high controllability.

According to a first aspect of the present invention, there is provided a film formation method for a semiconductor process for performing a film formation process to form a silicon-containing insulating film doped with a metal on a target substrate, in a process field inside a process container configured to be selectively supplied with a silicon source gas and a metal source gas, the method comprising: forming a first insulating thin layer by use of a chemical reaction of the silicon source gas, while maintaining a shut-off state of supply of the metal source gas; then, forming a first metal thin layer by use of a chemical reaction of the metal source gas, while maintaining a shut-off state of supply of the silicon source gas; and then, forming a second insulating thin layer by use of the chemical reaction of the silicon source gas, while maintaining a shut-off state of supply of the metal source gas, so as to laminate the first insulating thin layer, the first metal thin layer, and the second insulating thin layer in this order.

According to a second aspect of the present invention, there is provided a computer readable medium containing program instructions for execution on a processor for performing the method according to the first aspect in a film formation apparatus for a semiconductor process including a process field inside a process container configured to be selectively supplied with a silicon source gas and a metal source gas, wherein the program instructions, when executed by the processor, cause the film formation apparatus to form a silicon-containing insulating film doped with a metal on a target substrate inside the process field by performing the method according to the first aspect.

According to a third aspect of the present invention, there is provided a film formation apparatus for a semiconductor process, the apparatus comprising: a process container having a process field configured to accommodate a target substrate; a support member configured to support the target substrate inside the process field; a heater configured to heat the target substrate inside the process field; an exhaust system configured to exhaust gas from the process field; a supply system configured to supply a silicon source gas to the process field; a supply system configured to supply a metal source gas to the process field; and a control section configured to control an operation of the apparatus, wherein the control section is preset to perform a film formation process to form a silicon-containing insulating film doped with a metal on the target substrate in the process field, the film formation process comprising: forming a first insulating thin layer by use of a chemical reaction of the silicon source gas, while maintaining a shut-off state of supply of the metal source gas; then, forming a first metal thin layer by use of a chemical reaction of the metal source gas, while maintaining a shut-off state of supply of the silicon source gas; and then, forming a second insulating thin layer by use of the chemical reaction of the silicon source gas, while maintaining a shut-off state of supply of the metal source gas, so as to laminate the first insulating thin layer, the first metal thin layer, and the second insulating thin layer in this order.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 6A and 6B are timing charts showing the gas supply and RF (radio frequency) application used in the insulating thin layer formation step and metal thin layer formation step, respectively of a film formation method according to the embodiment of the present invention;

FIGS. 7A and 7B are graphs showing the aluminum concentration distribution in the metal-doped films shown in FIGS. 5A and 5B, respectively, obtained by an experiment.

DETAILED DESCRIPTION OF THE INVENTION

Figure 1:
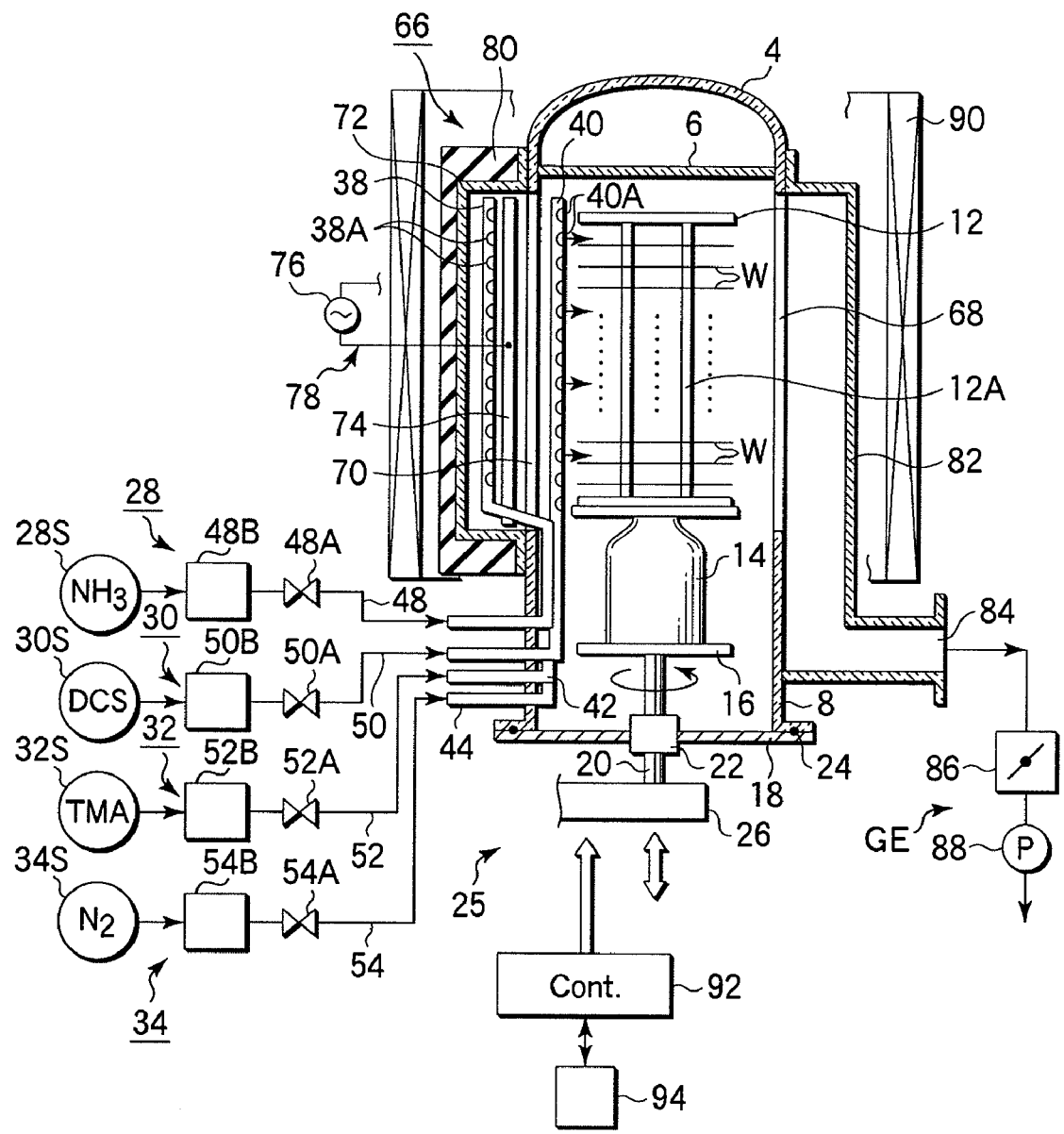
FIG. 1 is a sectional view showing a film formation apparatus (vertical CVD apparatus) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

Figure 2:
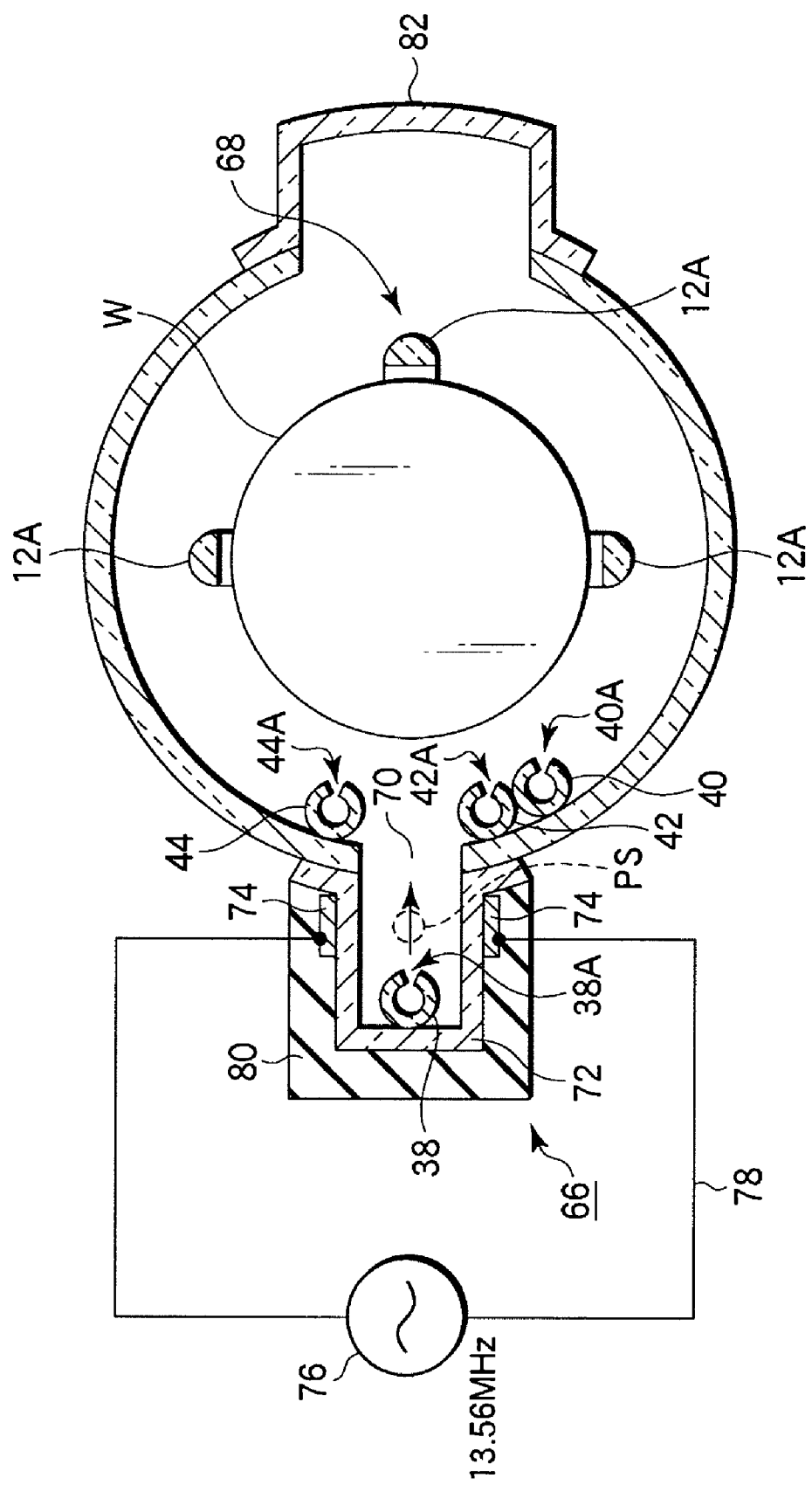
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichloro silane (DCS) gas as a silicon source gas, a second process gas containing ammonia ($NH_3$) gas as a nitriding gas or a reducing gas, and a third process gas containing TMA (trimethyl aluminum: organometal compound) gas as a metal source gas. The film formation apparatus 2 is configured to form a silicon nitride film doped with aluminum (SiAlN film), as an example of a silicon-containing insulating film doped with a metal, on target substrates by CVD in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is provided with a flange 8 surrounding the bottom port. A manifold made of stainless steel may be connected to the bottom of the process container 4.

A wafer boat 12 made of quartz is moved up and down through the bottom port of the process container 4, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the process container 4.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the process container 4, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down in unison. The table 16 may be fixed to the lid 18, so that wafers W are processed without rotation of the wafer boat 12.

A gas supply section is connected to a lower side of the process container 4 to supply predetermined process gases to the process field 5 within the process container 4. Specifically, the gas supply section includes a second process gas supply circuit 28, a first process gas supply circuit 30, a third process gas supply circuit 32, and a purge gas supply circuit 34. The first process gas supply circuit 30 is arranged to supply a first process gas containing a silicon source gas, such as DCS (dichloro silane) gas. The second process gas supply circuit 28 is arranged to supply a second process gas containing a nitriding gas or reducing gas, such as ammonia ($NH_3$) gas. The third process gas supply circuit 32 is arranged to supply a third process gas containing a metal source gas, such as TMA gas. The purge gas supply circuit 34 is arranged to supply a purge gas comprising an inactive gas, such as $N_2$ gas. Each of the first to third gases is mixed with a suitable amount of carrier gas, as needed. However, such a carrier gas will not be mentioned, hereinafter, for the sake of simplicity of explanation.

More specifically, the second, first, and third process gas supply circuits 28, 30, and 32, and the purge gas supply circuit 34 include gas distribution nozzles 38, 40, 42 and 44, respectively, which are connected to gas passages extending in radial directions in the flange 8 of the process container 4. Each of gas distribution nozzles 38, 40, 42 and 44 is formed of a quartz pipe that turns from a horizontal direction to a vertical direction and extends upward. In FIG. 1, for the sake of simplicity of explanation, the nozzles 38, 40, 42 and 44 are shown as penetrating the sidewall of the process container 4 on the lower side. The gas distribution nozzles 38, 40, 42 and 44 respectively have a plurality of gas spouting holes 38A, 40A, 42A, and 44A, each set of holes being formed at predetermined intervals in the longitudinal direction (the vertical direction) over all the wafers W on the wafer boat 12. Each set of the gas spouting holes 38A, 40A, 42A, and 44A delivers the corresponding process gas almost uniformly in the horizontal direction, so as to form gas flows parallel with the wafers W on the wafer boat 12.

The nozzles 38, 40, 42, and 44 are connected to gas sources 28S, 30S, 32S, and 34S of $NH_3$ gas, DCS gas, TMA gas, and $N_2$ gas, respectively, through gas supply lines (gas passages) 48, 50, 52, and 54, respectively. The gas supply lines 48, 50, 52, and 54 are provided with switching valves 48A, 50A, 52A, and 54A and flow rate controllers 48B, 50B, 52B, and 54B, such as mass flow controllers, respectively. With this arrangement, $NH_3$ gas, DCS gas, TMA gas, and $N_2$ gas can be supplied at controlled flow rates.

A gas exciting section 66 is formed at the sidewall of the process container 4 in the vertical direction. On the side of the process container 4 opposite to the gas exciting section 66, a long narrow exhaust port 68 for vacuum-exhausting the inner atmosphere is formed by cutting the sidewall of the process container 4 in, e.g., the vertical direction.

Specifically, the gas exciting section 66 has a vertically long narrow opening 70 formed by cutting a predetermined width of the sidewall of the process container 4 in the vertical direction. The opening 70 is covered with a quartz cover 72 airtightly connected to the outer surface of the process container 4 by welding. The cover 72 has a vertical long narrow shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long narrow electrodes 74 are disposed on the opposite outer surfaces of the cover 72, and face each other in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the second process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The second process gas containing $NH_3$ gas is spouted from the gas spouting holes 38A of the gas distribution nozzle 38 toward the plasma generation area PS. Then, the second process gas is excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At positions near and outside the opening 70 of the gas exciting section 66, the gas distribution nozzles 40, 42, and 44 of the first and third process gases and the purge gas are disposed. Specifically, the gas distribution nozzles 40 and 42 extend upward on one side of the outside of the opening 70 (in the process container 4), and the gas distribution nozzle 44 extends upward on the other side. The first process gas containing DCS gas, the third process gas containing TMA gas, and the purge gas comprising $N_2$ gas are spouted from the gas spouting holes 40A, 42A, and 44A of the gas distribution nozzles 40, 42, and 44, respectively, toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends downward along the sidewall of the process container 4 and then turns into a horizontal state to provide a gas outlet 84. The gas outlet 84 is connected to a vacuum-exhaust system GE including a pressure regulation valve 86 and a vacuum pump 88.

The process container 4 is surrounded by a heater 90, which is used for heating the atmosphere within the process container 4 and the wafers W. A thermocouple (not shown) is disposed near the exhaust port 68 in the process container 4 to control the heater 90.

The film formation apparatus 2 further includes a main control section 92 formed of, e.g., a computer, to control the entire apparatus. The main control section 92 can control the film formation process described below in accordance with the process recipe of the film formation process concerning, e.g., the film thickness and composition of a film to be formed, stored in the storage portion 94 thereof in advance. In the storage portion 94, the relationship between process conditions, such as process gas flow rates, and the thickness and composition of the film is also stored as control data in advance. Accordingly, the main control section 92 can control the elevating mechanism 25, gas supply circuits 28, 30, 32, 34, and 34, exhaust system GE, gas exciting section 66, heater 90, and so forth, based on the stored process recipe and control data.

Next, an explanation will be given of a film formation method performed in the apparatus shown in FIG. 1. In this film formation method, a silicon nitride film doped with aluminum (SiAlN film), as an example of a silicon-containing insulating film doped with a metal, is formed on semiconductor wafers. In order to achieve this, a first process gas containing dichloro silane (DCS) gas as a silicon source gas, a second process gas containing ammonia ($NH_3$) gas as a nitriding gas or reducing gas, and a third process gas containing TMA gas as a metal source gas are selectively supplied into the process field 5 accommodating wafers W. Specifically, a film formation process is performed along with the following operations.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first to third process gases and the purge gas are supplied from the respective gas distribution nozzles 40, 38, 42, and 44 at controlled flow rates with timings described later. During the film formation process, the interior of the process container 4 is kept vacuum-exhausted.

Figure 3:
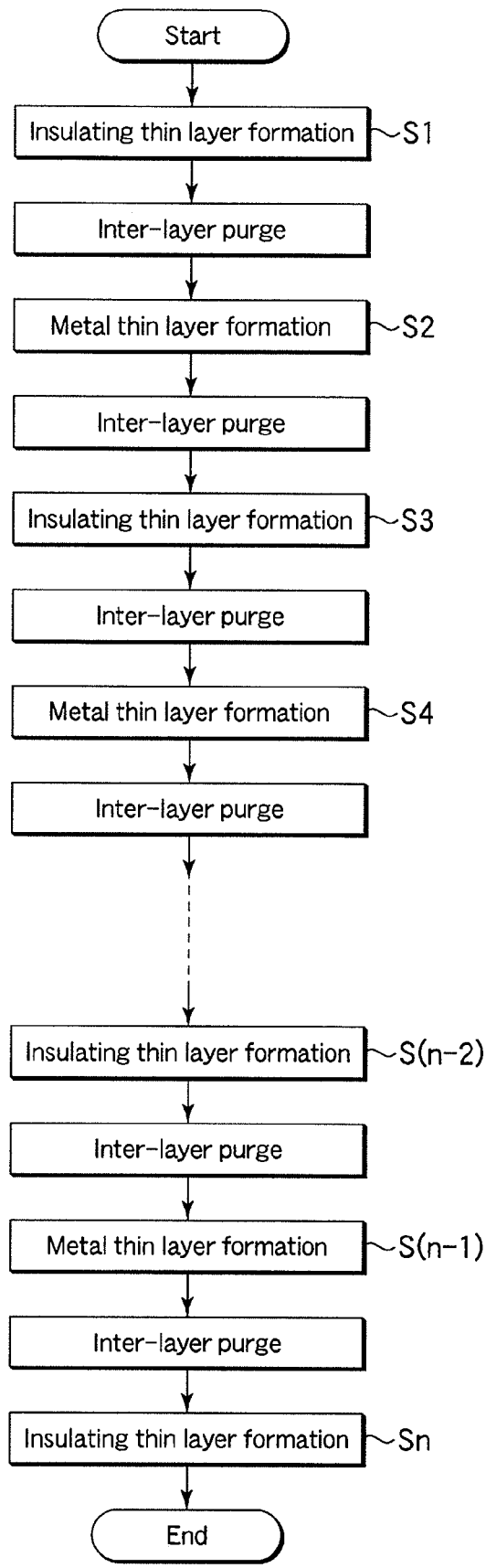
FIG. 3 is a flow chart showing a film formation method according to an embodiment of the present invention.

FIG. 3 is a flow chart showing a film formation method according to an embodiment of the present invention. As shown in FIG. 3, this embodiment is arranged to alternately repeat, a plurality of times, a step of forming an insulating thin layer by use of the silicon source gas and a step of forming a metal thin layer by use of the metal source gas, so as to form a silicon-containing insulating film doped with a metal.

In the insulating thin layer formation step, the first process gas containing DCS gas and the second process gas containing $NH_3$ gas are used. In the metal thin layer formation step, the third process gas containing TMA gas and the second process gas containing $NH_3$ gas are used. Between the insulating thin layer formation step and metal thin layer formation step, there is interposed an inter-layer purge step (intermediate step) of supplying the purge gas into the process container 4 to remove the residual gas. The film formation process starts with the insulating thin layer formation step and ends with the insulating thin layer formation step.

FIG. 3 shows a case where the insulating thin layer formation step and the metal thin layer formation step with the inter-layer purge step interposed therebetween are repeated in accordance with Step S1 to Step Sn ("n" is a positive integer of 3 or more). In this case, since "n" is 3 or more, at least one metal thin layer is formed.

Figure 4:
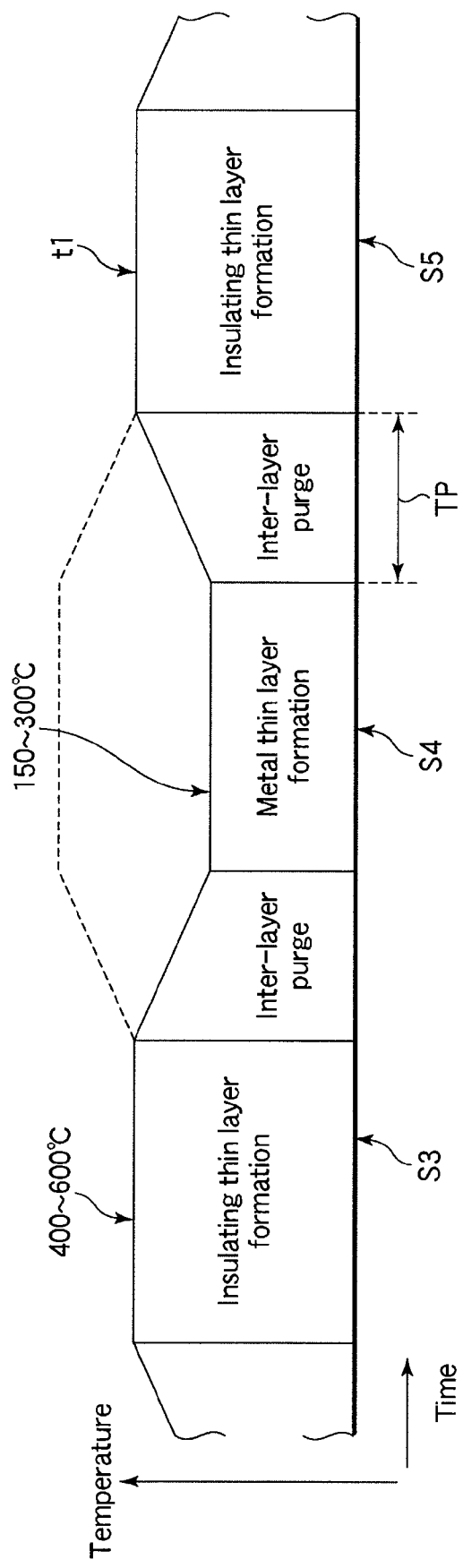
FIG. 4 is a diagram showing the relationship between the steps of the film formation method and temperature according to the embodiment of the present invention.

FIG. 4 is a diagram showing the relationship between the steps of the film formation method and temperature according to the embodiment of the present invention. As shown in FIG. 4, the process temperature of the metal thin layer formation step is preferably adjusted to an optimum value from that of the insulating thin layer formation step in accordance with the type of the metal source gas used in the metal thin layer formation step. This adjustment with a temperature increase or decrease is performed within the inter-layer purge step.

For example, the length of the inter-layer purge step is about 0.5 to 2.0 hours, although it depends on the volume of the process container 4. In FIG. 3, the lengths of insulating thin layer formation steps S1, S3 . . . and the lengths of metal thin layer formation steps S2, S4 . . . may be respectively adjusted. Where the lengths of the respective steps are suitably adjusted, the metal-doped film can be controlled in terms of the metal concentration therein and the metal concentration distribution in the film thickness direction.

Figure 5A:
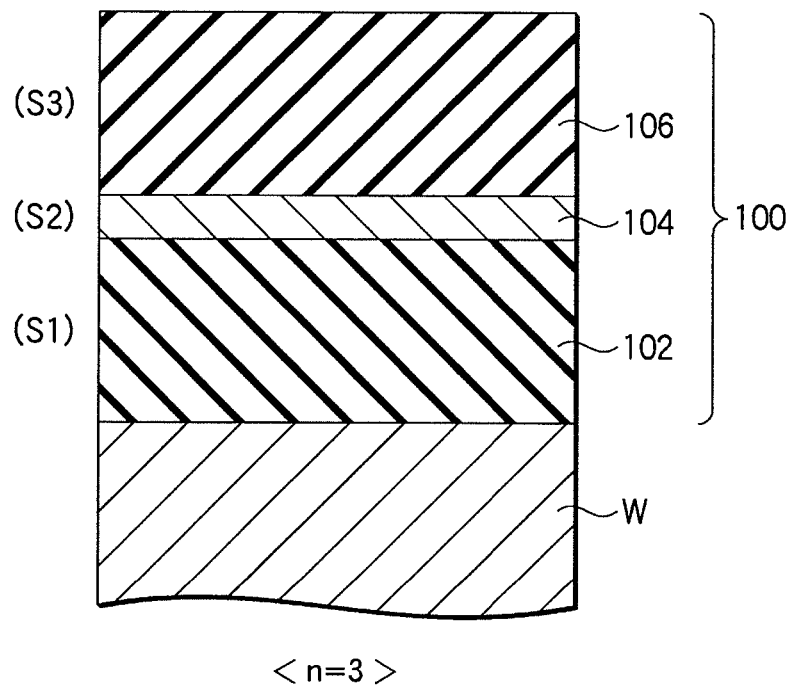
FIGS. 5A and 5B are enlarged sectional views showing different metal-doped films respectively formed by film formation methods according to the embodiment of the present invention.
Figure 5B:
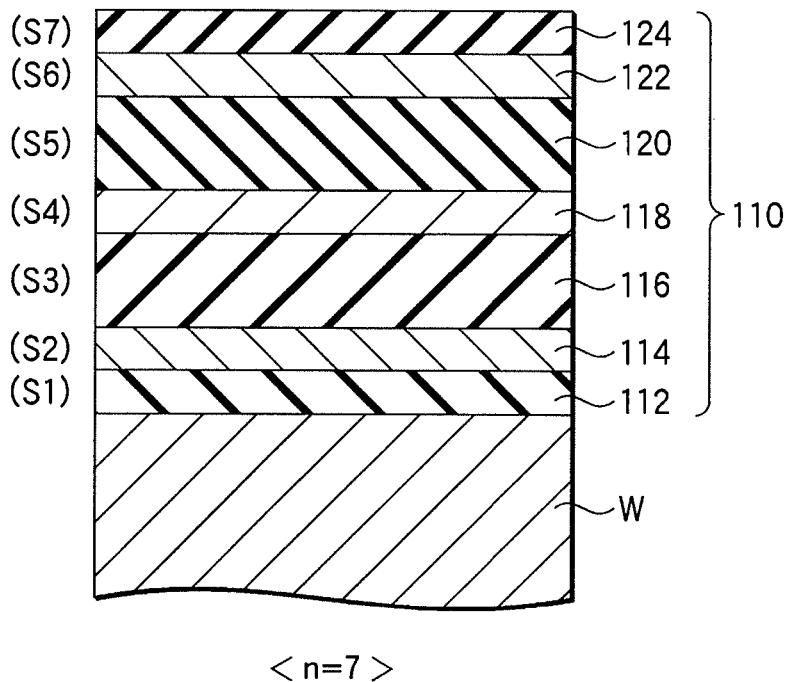

FIGS. 5A and 5B are enlarged sectional views showing different metal-doped films respectively formed by film formation methods according to the embodiment of the present invention. FIG. 5A shows a case where "in"=3 in FIG. 3, and FIG. 5B shows a case where "n"=7 in FIG. 3. Specifically, in the case shown in FIG. 5A, a metal-doped film 100 formed on the surface of a semiconductor wafer W consists of a first insulating thin layer 102 made of SiN formed in Step S1 of FIG. 3, a first metal thin layer 104 made of Al formed in Step S2, and a second insulating thin layer 106 made of SiN formed in Step S3 laminated in this order.

In the metal-doped film 100 shown in FIG. 5A, the first metal thin layer 104 has a very small thickness, and the insulating thin layers 102 and 106 above and below the layer 104 have large thicknesses. In this case, the metal-doped film 100 is designed such that the metal concentration is highest at the center in the film thickness direction. FIG. 5A clearly shows the border lines between the layers of the metal-doped film 100, but the border lines are not so clear in fact. This is so, because the metal, i.e., aluminum in the metal thin layer 104 is thermally diffused into the insulating thin layers 102 and 106 on its upper and lower sides due to the temperature of the film formation steps and a heating process performed as a post step.

In the case shown in FIG. 5B, a metal-doped film 110 consists of a first insulating thin layer 112 made of SiN formed in Step S1 of FIG. 3, a first metal thin layer 114 made of Al formed in Step S2, a second insulating thin layer 116 made of SiN formed in Step S3, a second metal thin layer 118 made of Al formed in Step S4, a third insulating thin layer 120 made of SiN formed in Step S5, a third metal thin layer 122 made of Al formed in Step S6, and a fourth insulating thin layer 124 made of SiN formed in Step S7 laminated in this order. In this case, unlike the case shown in FIG. 5A, the metal-doped film 110 is designed such that the metal concentration is almost constant in the film thickness direction.

FIG. 5B also clearly shows the border lines between the layers of the metal-doped film 110, but the border lines are not so clear in fact. This is so, because the metal, i.e., aluminum in the metal thin layers 114, 118, and 122 is thermally diffused into the insulating thin layers 112, 116, 120, and 124 on their upper and lower sides due to the temperature of the film formation steps and a heating process performed as a post step.

FIGS. 5A and 5B merely show examples of a metal-doped film, and the number of insulating thin layers and metal thin layers laminated one on top of the other is not limited to these examples. FIGS. 5A and 5B show structures in each of which a metal-doped film is directly formed on a wafer W for the sake of simplicity of explanation, but another thin film may be interposed between the wafer W and metal-doped film.

FIG. 6A is a timing chart showing the gas supply and RF (radio frequency) application used in the insulating thin layer formation step of a film formation method according to the embodiment of the present invention. As shown in FIG. 6A, in the insulating thin layer formation step, the first process gas containing DCS gas as a silicon source gas and the second process gas containing $NH_3$ gas as a nitriding gas are used, and the first to fourth sub-steps T1 to T4 are alternately repeated. A cycle comprising the first to fourth sub-steps T1 to T4 is performed once or repeated a plurality of times, and very thin layers of silicon nitride formed by respective cycles are laminated, thereby arriving at an insulating thin layer having a target thickness.

Specifically, the first sub-step T1 is arranged to perform supply of the first process gas (denoted as DCS in FIG. 6A) to the process field 5, while maintaining the shut-off state of supply of the second process gas (denoted as $NH_3$ in FIG. 6A) to the process field 5. The second sub-step T2 is arranged to maintain the shut-off state of supply of the first and second process gases to the process field 5. The third sub-step T3 is arranged to perform supply of the second process gas to the process field 5, while maintaining the shut-off state of supply of the first process gas to the process field 5. The fourth sub-step T4 is arranged to maintain the shut-off state of supply of the first and second process gases to the process field 5.

Each of the second and fourth sub-steps T2 and T4 is used as a purge sub-step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while maintaining the shut-off state of supply of all the gases. In this respect, the second and fourth sub-steps T2 and T4 may be arranged such that the first half utilizes only vacuum-exhaust and the second half utilizes both vacuum-exhaust and inactive gas supply.

In the third sub-step T3, the RF power supply 76 is set in the ON-state to turn the second process gas into plasma by the gas exciting section 66, so as to supply the second process gas in an activated state to the process field 5. Consequently, radicals derived from $NH_3$ gas are generated and enhance the reactivity with molecules of DCS gas and so forth adsorbed on the surface of the wafers W.

More specifically, the first process gas containing DCS gas is supplied from the gas spouting holes 40A of the gas distribution nozzle 40 to form gas flows parallel with the wafers W on the wafer boat 12. While being supplied, molecules of the DCS gas and molecules and atoms of decomposition products generated by decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. The second process gas is excited and partly turned into plasma when it passes through the plasma generation area PS between the pair of electrodes 74. At this time, for example, radicals (activated species), such as $N^*$, $NH^*$, $NH_2^*$, and $NH_3^*$, are produced (the symbol [*] denotes that it is a radical). The radicals and so forth derived from the $NH_3$ gas flow out from the opening 70 of the gas exciting section 66 toward the center of the process container 4, and are supplied into gaps between the wafers W in a laminar flow state.

The radicals and so forth react with (nitride) molecules and so forth of DCS gas adsorbed on the surface of the wafers W, so that a very thin layer of silicon nitride of an atomic level or molecular level is formed on the wafers W. Alternatively, when the DCS gas flows onto radicals and so forth derived from the $NH_3$ gas adsorbed on the surface of the wafers W, the same reaction is caused, so a silicon nitride layer is formed on the wafers W. The very thin layer of silicon nitride formed by one cycle comprising the first to fourth sub-steps T1 to T4 is set to have a thickness of about 0.1 nm. The cycle is repeated to laminate very thin layers of silicon nitride until an insulating thin layer having a predetermined thickness is formed.

The insulating thin layers 102, 106, 112, 116, 120, and 124 shown in FIGS. 5A and 5B are formed by the film formation process described above. The sub-step T1 of supplying the first process gas containing DCS gas is set to be about 3 to 60 seconds. The sub-step T3 of supplying the second process gas containing $NH_3$ gas is set to be about 10 to 120 seconds. Each of the purge sub-steps T2 and T4 is set to be about 10 to 60 seconds.

FIG. 6B is a timing chart showing the gas supply and RF (radio frequency) application used in the metal thin layer formation step of a film formation method according to the embodiment of the present invention. As shown in FIG. 6B, in the metal thin layer formation step, the third process gas containing TMA gas as a metal source gas and the second process gas containing $NH_3$ gas as a reactive gas are used, and the first to fourth sub-steps T11 to T14 are alternately repeated. A cycle comprising the first to fourth sub-steps T11 to T14 is performed once or repeated a plurality of times, and very thin layers of the metal formed by respective cycles are laminated, thereby arriving at a metal thin layer having a target thickness.

Specifically, the first sub-step T11 is arranged to perform supply of the third process gas (denoted as TMA in FIG. 6B) to the process field 5, while maintaining the shut-off state of supply of the second process gas (denoted as $NH_3$ in FIG. 6B) to the process field 5. The second sub-step T12 is arranged to maintain the shut-off state of supply of the second and third process gases to the process field 5. The third sub-step T13 is arranged to perform supply of the second process gas to the process field 5, while maintaining the shut-off state of supply of the third process gas to the process field 5. The fourth sub-step T14 is arranged to maintain the shut-off state of supply of the second and third process gases to the process field 5. Each of the second and fourth sub-steps T12 and T14 is used as a purge sub-step to remove the residual gas within the process container 4.

In the third sub-step T13, the RF power supply 76 is set in the ON-state to turn the second process gas into plasma by the gas exciting section 66, so as to supply the second process gas in an activated state to the process field 5. Consequently, radicals derived from $NH_3$ gas are generated, and enhance the reactivity with molecules of TMA gas and so forth adsorbed on the surface of the wafers W.

More specifically, the third process gas containing TMA gas is supplied from the gas spouting holes 42A of the gas distribution nozzle 42 to form gas flows parallel with the wafers W on the wafer boat 12. While being supplied, molecules of the TMA gas and molecules and atoms of decomposition products generated by decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. The second process gas is excited and partly turned into plasma when it passes through the plasma generation area PS between the pair of electrodes 74. The radicals and so forth derived from the $NH_3$ gas flow out from the opening 70 of the gas exciting section 66 toward the center of the process container 4, and are supplied into gaps between the wafers W in a laminar flow state.

The radicals and so forth react with molecules and so forth of TMA gas adsorbed on the surface of the wafers W, so that a very thin layer of the metal of an atomic level or molecular level is formed on the wafers W. The very thin layer of the metal formed by one cycle comprising the first to fourth sub-steps T11 to T14 is set to have a thickness of about 0.1 nm. The cycle is repeated to laminate very thin layers of the metal until a metal thin layer having a predetermined thickness is formed.

The metal thin layers 104, 114, 118, and 122 shown in FIGS. 5A and 5B are formed by the film formation process described above. The sub-step T11 of supplying the third process gas containing TMA gas is set to be about 3 to 60 seconds. The sub-step T13 of supplying the second process gas containing NH₃ gas is set to be about 10 to 120 seconds. Each of the purge sub-steps T12 and T14 is set to be about 10 to 60 seconds.

In the timing charts shown in FIGS. 6A and 6B, the film formation process can be started with and end with any sub-step of supplying the first process gas containing DCS gas, the third process gas containing TMA gas, the second process gas containing NH₃ gas, or purge gas.

In the insulating thin layer formation step, the process pressure is set to be within a range of 70 to 860 Pa, and the process temperature is set to be within a range of 400 to 600° C., and preferably of 450 to 550° C. (see FIG. 4). In the metal thin layer formation step, the process pressure is set to be within a range of 4 to 200 Pa, and the process temperature is set to be within a range of 150 to 300° C., and preferably of 200 to 250° C.

In FIG. 5A, the first insulating thin layer 102 is set to have a thickness of about 2.0 to 10.0 nm, such as about 3.9 nm, the first metal thin layer 104 is set to have a thickness of about 0.1 to 1.0 nm, such as about 0.1 to 0.3 nm, and the second insulating thin layer 106 is set to have a thickness of about 2.0 to 10.0 nm, such as about 4.0 nm. In FIG. 5B, each of the first and fourth insulating thin layers 112 and 124 is set to have a thickness of about 0.1 to 1.5 nm, such as about 0.2 to 0.5 nm, each of the second and third insulating thin layers 116 and 120 is set to have a thickness of about 0.2 to 3.0 nm, such as about 0.4 to 1.0 nm, and each of the first, second, and third metal thin layers 114, 118, and 122 is set to have a thickness of about 0.1 to 0.6 nm, such as about 0.1 to 0.3 nm.

In the film formation method according to this embodiment, where a metal-doped film 100 or 110 is formed, an insulating thin layer formation step of forming an insulating thin layer by use of a silicon source gas and a metal thin layer formation step of forming a metal thin layer by use of a metal source gas containing a metal, such as aluminum, are alternately repeated such that the metal thin layer formation step is included at least once. Consequently, it is possible to form a silicon-containing insulating film doped with a metal while setting the metal concentration to be relatively lower with high controllability and adjusting the metal concentration distribution in the film thickness direction.

Particularly, where the total thickness of metal thin layers is set to be far smaller than the total thickness of insulating thin layers, the metal concentration in the metal-doped film becomes very low. Such a metal-doped film is effectively applicable to the electric charge trap layer of a memory device, as described above.

<Experiment 1>

A metal-doped film 100 shown in FIG. 5A and a metal-doped film 110 shown in FIG. 5B were respectively formed by film formation methods according to the embodiment described above, and the metal concentration of the films were measured. DCS gas was used as a silicon source gas, TMA gas was used as a metal source gas, and NH₃ gas was used as a nitriding gas or reactive gas. Al in the metal-doped film was measured by SIMS (secondary ion mass spectrometry).

The metal-doped film 100 shown in FIG. 5A was formed such that the cycle shown in FIG. 6A was repeated 40 times to form each of the first and second insulating thin layers 102 and 106, and the cycle shown in FIG. 6B was repeated 6 times to form the first metal thin layer 104. The metal-doped film 110 shown in FIG. 5B was formed such that the cycle shown in FIG. 6A was repeated 3 times to form each of the first and fourth insulating thin layers 112 and 124, the cycle shown in FIG. 6A was repeated 6 times to form each of the second and third insulating thin layers 116 and 120, and the cycle shown in FIG. 6B was performed once to form each of the first, second, and third metal thin layers 114, 118, and 120.

FIGS. 7A and 7B are graphs showing the aluminum concentration distribution in the metal-doped films shown in FIGS. 5A and 5B, respectively, obtained by the experiment. As shown in FIG. 7A, where the metal-doped film was formed to include only one metal thin layer, the Al concentration had an acute peak near the center in the film thickness direction. On the other hand, as shown in FIG. 7B, where the metal-doped film was formed to have separate three metal thin layers, the Al concentration was almost uniformly diffused or distributed in the film thickness direction.

Accordingly, the metal concentration can be adjusted in the thickness direction of the metal-doped film by presetting the number of metal thin layers to be formed. Further, the level of the metal concentration can be controlled by presetting the thickness of each metal thin layer.

<Experiment 2>

The controllability of the metal concentration in the metal-doped film was examined by use of film formation methods according to the embodiment described above. In film formation apparatuses practically used, it is difficult to stably supply a small amount of metal source gas, and so it is not easy to address a metal doping amount for a lower concentration. In light of this, a method according to the embodiment described above may be arranged to sublimate or evaporate part of a metal thin layer previously formed, so as to practically realize a metal doping amount for a lower concentration. For example, after a metal thin layer is formed by the metal thin layer formation step (such as Step S4 in FIG. 4), the process temperature of the subsequent insulating thin layer formation step (S5) is controlled, so that the thickness of the metal thin layer is adjusted.

In this experiment, a metal-doped film 100 shown in FIG. 5A was formed while the process temperature t1 of the insulating thin layer formation step for forming the second insulating thin layer 106 was set at different values of 450° C. and 550° C. The process temperature of the metal thin layer formation step was set at 250° C., and the length TP of the inter-layer purge step (see FIG. 4) was set at one hour.

Figure 8:
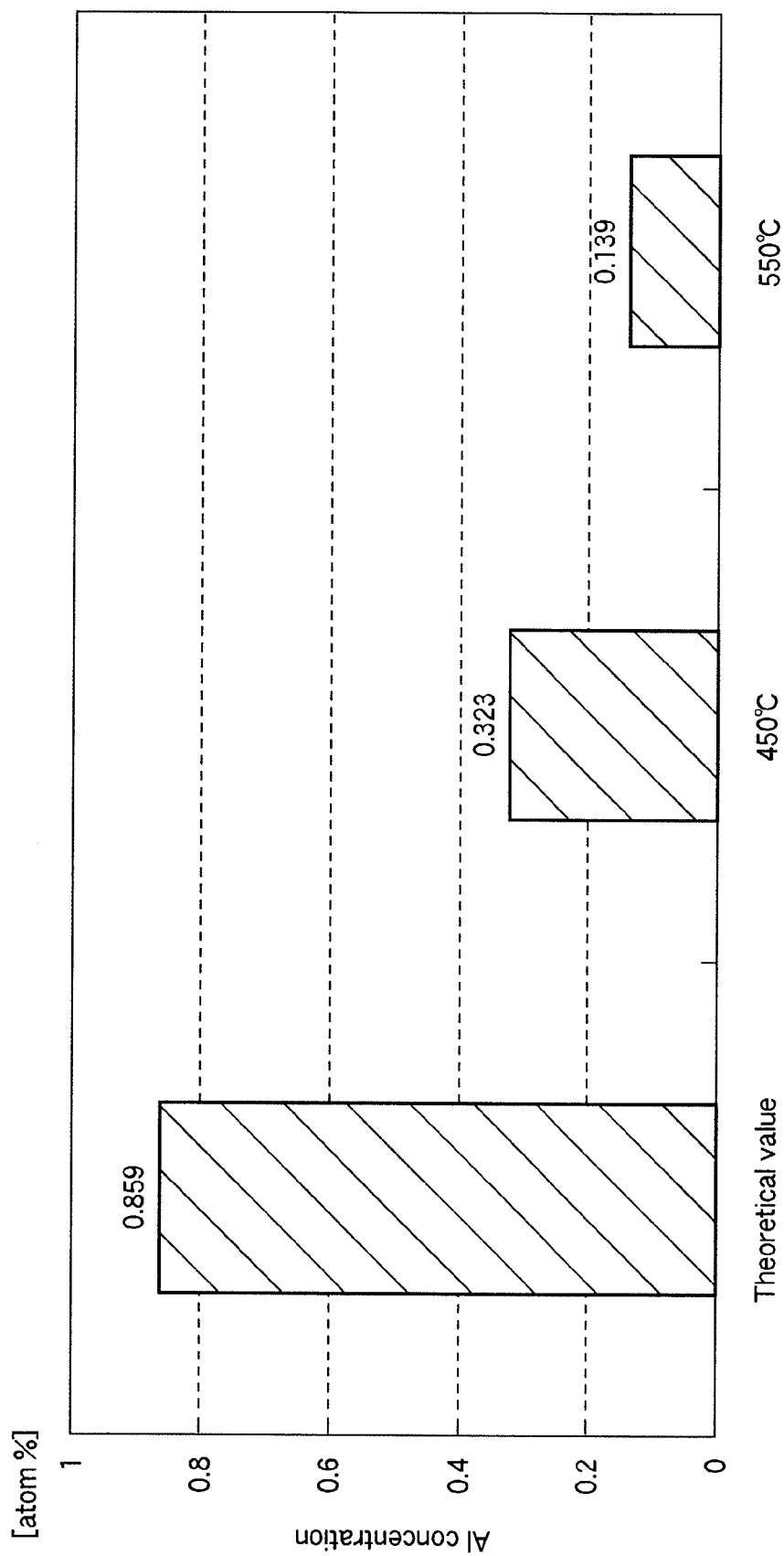
FIG. 8 is a graph showing the dependency of aluminum concentration on the temperature of the insulating thin layer formation step, obtained by an experiment.

FIG. 8 is a graph showing the dependency of aluminum concentration on the temperature of the insulating thin layer formation step, obtained by an experiment. In FIG. 8, the Al metal concentration is shown as converted to a value obtained by setting the total thickness of the metal-doped film at 7.0 nm. As shown in FIG. 8, the theoretical value of the metal concentration corresponding to the thickness of a metal thin layer formed by the metal thin layer formation step was 0.859 [atom %]. On the other hand, where the process temperature t1 of the insulating thin layer formation step performed immediately thereafter was set at 450° C., the metal concentration was decreased to 0.323 [atom %]. Further, where the process temperature t1 was set at 550° C., the metal concentration was further decreased to 0.139 [atom %].

Accordingly, after a metal thin layer is formed by the metal thin layer formation step, the insulating thin layer formation step performed immediately thereafter is set to use a process temperature adjusted within a permissible range (the process temperature is used as a parameter). In this case, the metal thin layer is sublimated or evaporated by a predetermined amount to have a modified thickness, so that the metal concentration can be controlled within a far lower concentration range.

From the same point of view, the length TP or set temperature of an inter-layer purge step may be alternatively used as a parameter for this purpose. In this case, the metal thin layer formed immediately before the inter-layer purge step is sublimated or evaporated by a predetermined amount to have a modified thickness, so that the metal concentration can be controlled within a far lower concentration range.

<Modification>

In the embodiment described above, as shown in FIGS. 6A and 6B, each of the insulating thin layer formation step and metal thin layer formation step are arranged such that RF is turned on to generate plasma and thereby to activate $NH_3$ gas in the sub-step of supplying the second process gas containing $NH_3$ gas as a nitriding gas or reactive gas. However, the insulating thin layer formation step and/or metal thin layer formation step may be arranged not to use plasma for activating $NH_3$ gas in supplying the $NH_3$ gas.

As shown in FIG. 6B, the metal thin layer formation step includes a sub-step of supplying the second process gas containing the reactive gas ($NH_3$). However, the metal thin layer formation step may merely supply the third process gas containing TMA gas without supplying the second process gas containing the reactive gas ($NH_3$) (and thus, plasma is not generated). In this case, if an organometal compound including an organic functional group or amide group is used as a metal source gas, a carbon component or hydrogen component may be mixed into the metal thin layer and adversely affect some of the characteristics thereof. However, in the insulating thin layer formation step performed immediately after the metal thin layer formation step, plasma is generated (see FIG. 6A) and serves to remove the carbon component or hydrogen component from the metal thin layer, and so the characteristics thereof can be hardly adversely affected.

In the embodiment described above, as shown in FIGS. 6A and 6B, each of the insulating thin layer formation step and metal thin layer formation step are arranged such that two process gases are alternately supplied in accordance with an ALD or MLD method. Alternatively, the insulating thin layer formation step and/or metal thin layer formation step may be arranged such that two process gases are simultaneously supplied in accordance with an ordinary CVD method. In such a modification, plasma for activating $NH_3$ gas may be not used in supplying the $NH_3$ gas in accordance with an ordinary thermal CVD method.

In the embodiment described above, a silicon nitride film (SiN) is formed as the insulating thin layer, but a silicon oxide film ($SiO_2$) may be formed for the same purpose by supplying an oxidizing gas in place of the nitriding gas.

In the embodiment described above, the silicon source gas contained in the first process gas is exemplified by DCS gas. In this respect, the silicon source gas may comprise one or more gases selected from the group consisting of DCS (dichloro silane), tetraethoxy silane (TEOS), tetramethyl silane (TMS), HCD (hexachloro disilane), monosilane ($SiH_4$), disilane ($Si_2H_6$), HMDS (hexamethyl disilazane), TCS (trichloro silane), DSA (disilylamine), TSA (trisilylamine), BTBAS (bistertialbutylamino silane), 3DMAS (tris-dimethylamino silane), 4DMAS (tetrakisdimethylamino silane), TEMASiH (trisethylmethylamino silane), TEMASi (tetrakis-ethylmethylamino silane), and $Si(MMP)_4$ (tetrakis-methoxymethylpropoxy silane).

In the embodiment described above, the metal source gas contained in the third process gas is exemplified by TMA gas. In this respect, the metal source gas may comprise one or more gases selected from the group consisting of TMA (trimethyl aluminum), Cu(hfac)TMVS (hexafluoroacetylacetonate-trimethyl-vinylsilyl copper), $Cu(EDMDD)_2$, TBTDET (tertiary-butylimide-tridiethylamide tantalum), PET (pentaethoxy tantalum), $TiCl_4$ (titanium tetrachloride), $AlCl_3$ (aluminum trichloride), TEH (tetrakisethoxy hafnium), $Zr(OtBt)_4$, HTTB (hafnium tetratertiarybutoxide), TDMAH (tetrakisdimethylamino hafnium), TDEAH (tetrakis-diethylamino hafnium), TEMAH (tetrakisethylmethylamino hafnium), $Hf(MMP)_4$ (tetrakismethoxymethylpropoxy hafnium), ZTTB (zirconiumtetratertiarybutoxide), TDMAZ (tetrakisdimethylamino zirconium), TDEAZ (tetrakis-diethylamino zirconium), TEMAZ (tetrakis-ethylmethylamino zirconium), $Zr(MMP)_4$ (tetrakis-methoxymethylpropoxy zirconium), TEA (tetraethyl aluminum), and $Al(MMP)_3$ (tris-methoxymethylpropoxy aluminum).

A nitriding gas for forming a silicon nitride film may comprise $NH_3$ or $N_2$ gas. An oxidizing gas for forming a silicon oxide film may comprise one or more gases selected from the group consisting of $O_2$, $O_3$, $H_2O$, $H_2O_2$, $N_2O$, and NO. A purge gas may comprise an inactive gas, such as $N_2$ gas or a rare gas, e.g., He or Ar.

In the embodiment described above, the film formation apparatus is exemplified by a film formation apparatus of the batch type that processes a plurality of target substrates all together. Alternatively, the present invention may be applied to a single-substrate film formation apparatus that processes target substrates one by one. A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for performing a film formation process to form a silicon-containing insulating film doped with a metal on a target substrate, in a process field, inside a process container configured to be selectively supplied with a silicon source gas and a metal source gas, the method comprising:
    forming a first insulating thin layer by use of a chemical reaction of the silicon source gas, while maintaining a shut-off state of supply of the metal source gas;
    then, forming a first metal thin layer by use of a chemical reaction of the metal source gas, while maintaining a shut-off state of supply of the silicon source gas; and
    then, forming a second insulating thin layer by use of the chemical reaction of the silicon source gas, while maintaining a shut-off state of supply of the metal source gas,
    so as to laminate the first insulating thin layer, the first metal thin layer, and the second insulating thin layer in this order,
    wherein the process field is configured to be selectively supplied with a $NH_3$ gas,
    each of said forming a first insulating thin layer and said forming a second insulating thin layer is arranged to cause the $NH_3$ gas to chemically react with the silicon source gas, and
    said forming a first metal thin layer is arranged to cause the $NH_3$ gas to chemically react with the metal source gas.

2. The method according to claim 1, wherein the first metal thin layer has a thickness of 0.1 to 1.0 nm.

3. The method according to claim 1, wherein the silicon-containing insulating film doped with a metal comprises the first insulating thin layer as a lowermost layer.

4. The method according to claim 1, wherein the silicon-containing insulating film doped with a metal comprises the second insulating thin layer as an uppermost layer.

5. The method according to claim 1, wherein, subsequently to said forming a second insulating thin layer, the method further comprises:
- forming a second metal thin layer by use of the chemical reaction of the metal source gas, while maintaining a shut-off state of supply of the silicon source gas; and
- then, forming a third insulating thin layer by use of the chemical reaction of the silicon source gas, while maintaining a shut-off state of supply of the metal source gas, so as to laminate the first insulating thin layer, the first metal thin layer, the second insulating thin layer, the second metal thin layer, and the third insulating thin layer in this order.

6. The method according to claim 5, wherein each of the first and second metal thin layers has a thickness of 0.1 to 0.6 nm, and the second insulating thin layer has a thickness of 0.2 to 3.0 nm.

7. The method according to claim 1, wherein said forming a first metal thin layer is arranged to alternately repeat, a plurality of times,
- a first supply sub-step of performing supply of the metal source gas to the process field, while maintaining a shut-off state of supply of the $NH_3$ gas, and
- a second supply sub-step of performing supply of the $NH_3$ gas to the process field, while maintaining a shut-off state of supply of the metal source gas.

8. The method according to claim 7, wherein the second supply sub-step comprises an excitation period of supplying the $NH_3$ gas to the process field while exciting the $NH_3$ gas by a plasma exciting mechanism.

9. The method according to claim 1, wherein the method further comprises first and second intermediate steps of exhausting residual gas from the process field while maintaining a shut-off state of supply of the silicon source gas and the metal source gas, respectively, between said forming a first insulating thin layer and said forming a first metal thin layer and between said forming a first metal insulating thin layer and said forming a second insulating thin layer.

10. The method according to claim 9, wherein the method further comprises using a set temperature of the second intermediate step as a parameter to modify a thickness of the first metal thin layer, thereby controlling a metal concentration in the silicon-containing insulating film doped with a metal.

11. The method according to claim 9, wherein the method further comprises using a length of the second intermediate step as a parameter to modify a thickness of the first metal thin layer, thereby controlling a metal concentration in the silicon-containing insulating film doped with a metal.

12. The method according to claim 1, wherein each of said forming a first insulating thin layer and said forming a second insulating thin layer is arranged to alternately repeat, a plurality of times,
- a first supply sub-step of performing supply of the silicon source gas to the process field, while maintaining a shut-off state of supply of the $NH_3$ gas, and
- a second supply sub-step of performing supply of the $NH_3$ gas to the process field, while maintaining a shut-off state of supply of the silicon source gas.

13. The method according to claim 12, wherein the second supply sub-step comprises an excitation period of supplying the $NH_3$ gas to the process field while exciting the $NH_3$ gas by a plasma exciting mechanism.

14. The method according to claim 1, wherein the silicon source gas comprises at least one gas selected from the group consisting of DCS (dichloro silane), tetraethoxy silane (TEOS), tetramethyl silane (TMS), HCD (hexachloro disilane), monosilane ($SiH_4$), disilane ($Si_2H_6$), HMDS (hexamethyl disilazane), TCS (trichloro silane), DSA (disilylamine), TSA (trisilylamine), BTBAS (bistertialbutylamino silane), 3DMAS (trisdimethylamino silane), 4DMAS (tetrakisdimethylamino silane), TEMASiH (trisethylmethylamino silane), TEMASi (tetrakis-ethylmethylamino silane), and $Si(MMP)_4$ (tetrakis-methoxymethylpropoxy silane).

15. The method according to claim 1, wherein the metal source gas comprises at least one gas selected from the group consisting of TMA (trimethyl aluminum), Cu(hfac)TMVS (hexafluoroacetylacetonate-trimethyl-vinylsilyl copper), $Cu(EDMDD)_2$, TBTDET (tertiary-butylimide-tridiethylamide tantalum), PET (pentaethoxy tantalum), $TiCl_4$ (titanium tetrachloride), $AlCl_3$ (aluminum trichloride), TEH (tetrakisethoxy hafnium), $Zr(OtBt)_4$, HTTB (hafnium tetratertiarybutoxide), TDMAH (tetrakisdimethylamino hafnium), TDEAH (tetrakis-diethylamino hafnium), TEMAH (tetrakis-ethylmethylamino hafnium), $Hf(MMP)_4$ (tetrakismethoxymethylpropoxy hafnium), ZTTB (zirconiumtetratertiarybutoxide), TDMAZ (tetrakisdimethylamino zirconium), TDEAZ (tetrakis-diethylamino zirconium), TEMAZ (tetrakis-ethylmethylamino zirconium), $Zr(MMP)_4$ (tetrakis-methoxymethylpropoxy zirconium), TEA (tetraethyl aluminum), and $Al(MMP)_3$ (trismethoxymethylpropoxy aluminum).

16. A computer readable non-transitory storage medium containing program instructions for execution on a processor for performing the method according to claim 1 in a film formation apparatus for a semiconductor process including the process field inside the process container, wherein the program instructions, when executed by the processor, cause the film formation apparatus to form a silicon-containing insulating film doped with a metal on a target substrate inside the process field by performing the method according to claim 1.

17. A film formation apparatus for a semiconductor process, the apparatus comprising:
- a process container having a process field configured to accommodate a target substrate;
- a support member configured to support the target substrate inside the process field;
- a heater configured to heat the target substrate inside the process field;
- an exhaust system configured to exhaust gas from the process field;
- a supply system configured to supply a silicon source gas to the process field;
- a supply system configured to supply a metal source gas to the process field;
- a supply system configured to supply a $NH_3$ gas to the process field; and
- a control section configured to control an operation of the apparatus,
- and including a computer readable non-transitory storage medium containing program instructions for execution on a processor,
- wherein the program instructions, when executed by the processor, cause the film formation apparatus to form a silicon-containing insulating film doped with a metal on the target substrate inside the process field by performing the method according to claim 1.

* * * * *

UNITED STATES PATENT AND TRADEMARK OFFICE
CERTIFICATE OF CORRECTION

| | | |
|---|---|---|
| PATENT NO. | : 8,034,673 B2 | Page 1 of 1 |
| APPLICATION NO. | : 12/417939 | |
| DATED | : October 11, 2011 | |
| INVENTOR(S) | : Kadonaga et al. | |

It is certified that error appears in the above-identified patent and that said Letters Patent is hereby corrected as shown below:

On the Title Page, item (22) Filing Date should read—April 3, 2009

Signed and Sealed this
Thirteenth Day of May, 2014

Michelle K. Lee
*Deputy Director of the United States Patent and Trademark Office*